(12) United States Patent
Schuegraf

(10) Patent No.: US 6,965,132 B1
(45) Date of Patent: Nov. 15, 2005

(54) POLYCRYSTALLINE SILICON EMITTER HAVING AN ACCURATELY CONTROLLED CRITICAL DIMENSION

(75) Inventor: Klaus F. Schuegraf, Aliso Viejo, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/321,877

(22) Filed: Dec. 17, 2002

Related U.S. Application Data

(62) Division of application No. 09/721,551, filed on Nov. 17, 2000.

(51) Int. Cl.$^7$ ............... H01L 31/0328; H01L 31/0336; H01L 31/072; H01L 31/109
(52) U.S. Cl. ...................... 257/197; 257/539; 257/565
(58) Field of Search ............................... 257/526, 183, 257/197, 565, 370, 378, 539

(56) References Cited

U.S. PATENT DOCUMENTS

| | | | |
|---|---|---|---|
| 4,443,932 A * | 4/1984 | Mastroianni et al. | 438/449 |
| 5,106,767 A * | 4/1992 | Comfort et al. | 437/31 |
| 5,846,869 A * | 12/1998 | Hashimoto et al. | 438/365 |
| 5,973,372 A * | 10/1999 | Omid-Zohoor et al. | 257/383 |
| 6,020,246 A * | 2/2000 | Koscielniak et al. | 438/341 |
| 6,251,738 B1 * | 6/2001 | Huang | 438/312 |
| 6,355,544 B1 * | 3/2002 | Essaian et al. | 438/535 |

FOREIGN PATENT DOCUMENTS

| | | | | |
|---|---|---|---|---|
| JP | 401216572 | * | 8/1989 | H01L 29/72 |
| JP | 402196432 A | * | 8/1990 | H01L 21/331 |
| JP | 404094132 | * | 3/1992 | H01L 21/331 |
| JP | 406029304 | * | 2/1994 | H01L 21/331 |

OTHER PUBLICATIONS

S. Wolf and R.N. Tauber, Silicon Processing for the VLSI, Lattice Press, vol. 1, 1986, p. 161.*
Merriam-Webster Online Dictionary.*

* cited by examiner

*Primary Examiner*—Mary Wilczewski
*Assistant Examiner*—Monica Lewis
(74) *Attorney, Agent, or Firm*—Farjami & Farjami LLP

(57) ABSTRACT

According to a disclosed embodiment, an etch stop layer is fabricated on top of a base. An amorphous layer is then formed on top of the etch stop layer. An opening is then etched in the amorphous layer and the etch stop layer. The opening is etched with an opening width substantially equal to a critical dimension. The opening with opening width substantially equal to a critical dimension is then filled with a polycrystalline emitter. The resulting polycrystalline emitter has an emitter width substantially equal to the critical dimension. Moreover, a polycrystalline emitter structure can be fabricated, in which the critical dimension, i.e. the emitter width, is precisely controlled. The result is a polycrystalline emitter structure which is substantially as small as the resolution that the photolithography process would allow.

6 Claims, 6 Drawing Sheets

POLYCRYSTALLINE SILICON EMITTER HAVING AN ACCURATELY CONTROLLED CRITICAL DIMENSION

This application is a divisional of application Ser. No. 09/721,551 filed Nov. 17, 2000.

BACKGROUND OF THE INVENTION

1. Field of the Invention

The present invention relates to the field of fabrication of semiconductor devices. More specifically, the invention relates to the fabrication of silicon-germanium semiconductor devices.

2. Related Art

In a heterojunction bipolar transistor, or HBT, a thin silicon-germanium layer is grown as the base of a bipolar transistor on a silicon wafer. The silicon-germanium HBT has significant advantages in speed, frequency response, and gain when compared to a conventional silicon bipolar transistor. Speed and frequency response can be compared by the cutoff frequency which, simply stated, is the frequency where the gain of a transistor is drastically reduced. Cutoff frequencies in excess of 100 GHz have been achieved for the HBT, which are comparable to the more expensive GaAs. Previously, silicon-only devices have not been competitive for use where very high speed and frequency response are required.

The higher gain, speeds, and frequency response of the HBT have been achieved as a result of certain advantages of silicon-germanium not available with pure silicon, for example, narrower band gap, and reduced resistivity. Silicon-germanium may be epitaxially grown on silicon wafers using conventional silicon processing and tools, and allows one to engineer device properties such as the band gap, energy band structure, and mobilities. For example, it is known in the art that grading the concentration of germanium in the silicon-germanium base builds into the HBT device an electric field, which accelerates the carriers across the base, thereby increasing the speed of the HBT device compared to a silicon-only device. One method for fabricating silicon and silicon-germanium devices is by chemical vapor deposition ("CVD"). A reduced pressure chemical vapor deposition technique, or RPCVD, used to fabricate the HBT device allows for a controlled grading of germanium concentration across the base layer. As already noted, speeds in the range of approximately 100 GHz have been demonstrated for silicon-germanium devices, such as the HBT.

A polycrystalline silicon emitter can be formed above the epitaxially grown single crystal silicon-germanium base. There are several possible methods of forming a polycrystalline silicon emitter. For example, a simple way would be to deposit polycrystalline silicon above the epitaxially grown single crystal silicon-germanium base, mask the emitter area with photoresist, and etch to form the emitter. A problem with this approach is that it is difficult to stop the etch of the emitter without etching into the single crystal silicon-germanium base. Etching into the single crystal base can cause, for example, damage in the form of pitting and recessing the silicon-germanium base. Pitting can lead, for example, to loss of base doping control and loss of device integrity. It is necessary to stop the etch precisely at the interface between the polycrystalline silicon emitter and the single crystal silicon-germanium base, but both emitter and base are substantially the same material at the interface. Thus, it is difficult, if not impossible, to selectively etch the polycrystalline silicon emitter without etching the single crystal silicon-germanium base. A different approach to the problem is needed.

One such approach is to form a layer of some material which can be selectively etched to the single crystal silicon-germanium base and open a "window" in that material in which to deposit the polycrystalline silicon for the emitter. After the polycrystalline silicon is deposited for the emitter, the excess material is etched away selectively to the silicon-germanium base, forming the polycrystalline silicon emitter above the single crystal silicon-germanium base.

It is critical to the proper performance of the HBT that the dimension of the width and length of the emitter be very accurately controlled. A dimension which critically affects the performance of devices on a semiconductor wafer, for example the emitter width of the HBT, is generally referred to as critical dimension, or "CD." Chip manufacturers calculate a CD "budget" for the semiconductor wafer, which is the allowable variation for critical dimensions on the wafer surface. As feature sizes for devices on the surface of the semiconductor wafer become smaller, it becomes more difficult to accurately control the dimensions of features such as the emitter window discussed above.

Control of dimensions is difficult because each step in the photolithographic patterning process contributes variations. For example, unwanted variation in dimension of a feature may be caused by defects in the photomask; reflectivity of a surface of the material below the photoresist, referred to as "subsurface reflectivity," which causes scattering of the light used to expose the photoresist; adhesion problems between an antireflective coating and the wafer and photomask; or poor matching of index of refraction between an antireflective coating and the photomask. Thus, as feature sizes become smaller, the CD budget becomes stricter, necessitating more accurate control over critical dimensions, for example the emitter width of the silicon-germanium HBT. In the case of the silicon-germanium NPN HBT control of the emitter width is essential to the performance of the device.

In the above approach of opening an emitter window in a layer of material which can be selectively etched to the single crystal silicon-germanium base, one possible material is silicon nitride. Critical dimension control of the emitter window is difficult with silicon nitride because silicon nitride is subject to subsurface reflectivity, as discussed above. Control of the critical dimension of the emitter is also difficult with silicon nitride because the wet clean process used to prepare the surface of silicon-germanium base prior to deposition of the polycrystalline silicon emitter in the emitter window laterally etches the silicon nitride, increasing the width of the emitter window and thereby causing unwanted variation in the critical dimension. Thus, the use of silicon nitride does not provide a satisfactory solution to the problem of forming a polycrystalline silicon emitter with critical dimension control.

Another possible material to use in the above approach of opening an emitter window in a layer of material which can be selectively etched to the single crystal silicon-germanium base is silicon oxynitride. Silicon oxynitride has less subsurface reflectivity than silicon nitride, but it is difficult to selectively etch silicon oxynitride to silicon oxide, leading to pitting and recessing damage of the silicon-germanium base as discussed above. In addition, unwanted silicon oxynitride is difficult to remove after the emitter has been formed. Unremoved silicon oxynitride can degrade performance of the silicon-germanium HBT. Thus, the use of silicon oxynitride does not provide a satisfactory solution to the problem of forming a polycrystalline silicon emitter with critical dimension control.

There is thus a need in the art for a polycrystalline silicon emitter structure in which the width dimension is precisely controlled. There is also need in the art for a smaller polycrystalline silicon emitter structure. Further, there is a need in the art for a polycrystalline silicon emitter structures as small as the resolution of the photolithography process will allow. Moreover, there is need in the art for a method of fabricating a polycrystalline emitter structure in which precise control of critical dimension enables the fabrication of a polycrystalline emitter structure as small as the resolution of the photolithography process will allow.

SUMMARY OF THE INVENTION

The present invention is directed to method for controlling critical dimension in a polycrystalline silicon emitter and related structure. The invention overcomes the need in the art for a method of fabricating a polycrystalline emitter structure in which precise control of critical dimension enables the fabrication of a polycrystalline emitter structure as small as the resolution of the photolithography process will allow. Moreover, the invention overcomes the need in the art for a polycrystalline silicon emitter structure in which the width dimension is precisely controlled. The invention also overcomes the need in the art for a smaller polycrystalline silicon emitter structure.

According to the invention, an etch stop layer is fabricated on top of a base. For example, the etch stop layer can be silicon oxide fabricated on top of the base of a silicon-germanium heterojunction bipolar transistor. An amorphous layer is then formed on top of the etch stop layer. For example, the amorphous layer can be formed of a silicon amorphous layer.

An opening is then etched in the amorphous layer and the etch stop layer. For example, a dry etch can be used to etch the amorphous layer, and hydrogen fluoride can be used to etch the silicon oxide etch stop layer. The opening is etched with an opening width substantially equal to a critical dimension. For example, control can be achieved over the width of the etching by limiting the thickness of the etch stop layer, and adding silicon oxynitride antireflective coating on the amorphous layer prior to patterning photoresist.

The opening with opening width substantially equal to a critical dimension is then filled with a polycrystalline emitter. The resulting polycrystalline emitter has an emitter width substantially equal to the critical dimension. The polycrystalline emitter can comprise, for example, polycrystalline silicon.

Moreover, a polycrystalline emitter structure can be fabricated, in which the critical dimension, i.e. the emitter width, is precisely controlled. The result is a polycrystalline emitter structure which is substantially as small as the resolution that the photolithography process would allow. For example, the polycrystalline silicon emitter of a heterojunction bipolar transistor can be formed according to the method of the invention.

BRIEF DESCRIPTION OF THE DRAWINGS

FIG. 3A illustrates cross sectional views, which include portions of a silicon wafer processed according to an embodiment of the invention, corresponding to certain steps of FIG. 2.

FIG. 3B illustrates cross sectional views, which include portions of a silicon wafer processed according to an embodiment of the invention, corresponding to certain steps of FIG. 2.

FIG. 3C illustrates cross sectional views, which include portions of a silicon wafer processed according to an embodiment of the invention, corresponding to certain steps of FIG. 2.

DETAILED DESCRIPTION OF THE INVENTION

The present invention is directed to method for controlling critical dimension in a polycrystalline silicon emitter and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
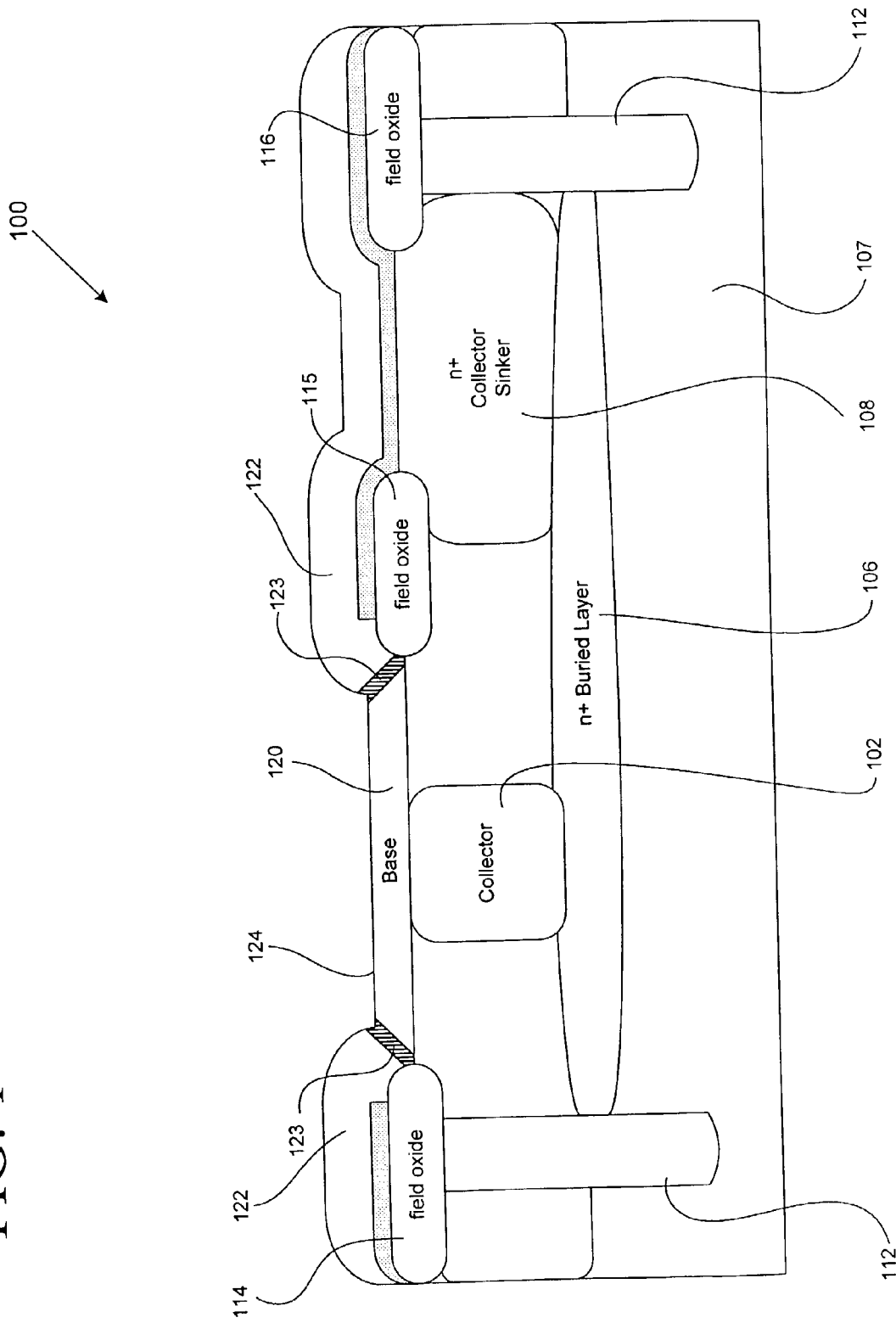
FIG. 1 illustrates a cross sectional view of some of the features of an NPN HBT prior to application of the steps taken to implement an embodiment of the present invention.

FIG. 1 shows exemplary structure 100 which is used to describe the present invention. Certain details and features have been left out of FIG. 1 which are apparent to a person of ordinary skill in the art. Structure 100 includes collector 102 and base 120 for a silicon-germanium heterojunction bipolar transistor ("HBT"). Collector 102 is N-type single crystal silicon which can be formed using a dopant diffusion process in a manner known in the art. Base 120 is P-type silicon-germanium single crystal deposited epitaxially in a "nonselective" RPCVD process. As seen in FIG. 1, base 120 is situated on top of, and forms a junction with, collector 102. Base contact 122 is polycrystalline silicon-germanium deposited epitaxially in a "nonselective" RPCVD process. Base 120 and base contact 122 connect with each other at interface 123 between the contact polycrystalline material and the base single crystal material. Base 120 has a top surface 124. It is an object of one embodiment of the invention as described below to form an emitter comprised of N-type polycrystalline silicon on top surface 124 of base 120. By the addition of emitter and formation of junctions and other structures in a manner known in the art, an NPN HBT is formed which includes collector 102 and base 120.

As seen in FIG. 1, buried layer 106, which is composed of N+ type material—meaning that it is relatively heavily doped N-type material—is formed in silicon substrate 107 in a manner known in the art. Collector sinker 108, also composed of N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in any of the Figures). Deep trenches 112 and field oxide isolation regions 114, 115, and 116 composed of silicon oxide ($SiO_2$) material are formed in a manner known in the art. Deep trenches 112 and field oxide isolation regions 114, 115, and 116 provide electrical isolation from other devices on silicon substrate 107 in a manner known in the art. Thus FIG. 1 shows that structure 100 includes several features and components used to form an HBT at a stage prior to formation of an emitter comprised of N-type polycrystalline silicon above base 120.

Figure 2:
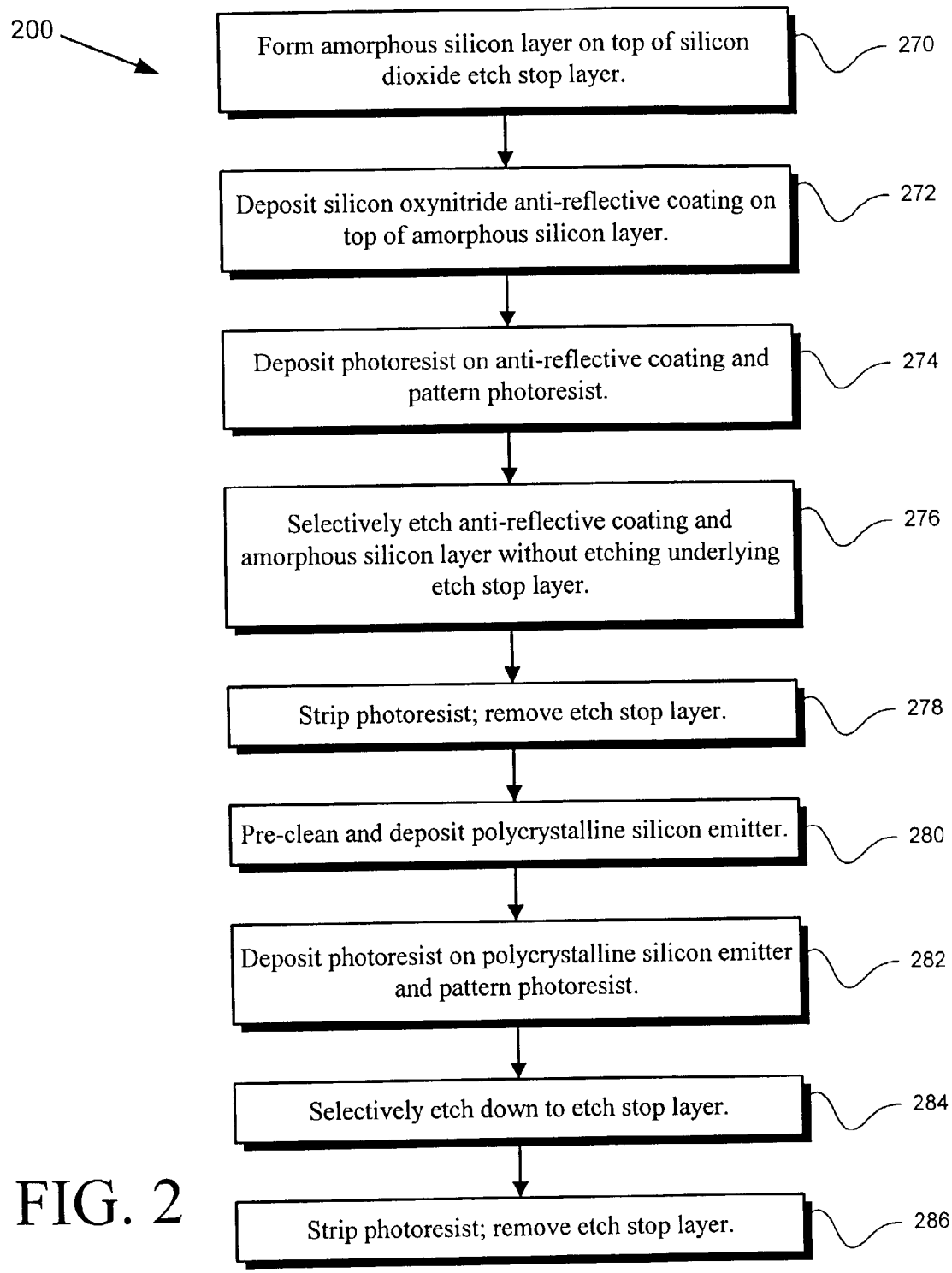
FIG. 2 shows a flowchart illustrating the steps taken to implement an embodiment of the present invention.

FIG. 2 shows flowchart 200 which describes the steps, according to one embodiment of the invention, in processing a wafer which includes structure 100. Certain details and features have been left out of flowchart 200 which are apparent to a person of ordinary skill in the art, for example, a step may consist of one or more substeps or may involve specialized equipment, as known in the art.

Steps 270 through 284 indicated in flowchart 200 are sufficient to describe one embodiment of the present invention, other embodiments of the invention may use steps different from those shown in flowchart 200. It is noted that the processing steps shown in flowchart 200 are performed on a wafer which, prior to step 270, includes structure 100 shown in FIG. 1. In particular the wafer includes top surface 124 of base 120 on which formation of an emitter comprised of N-type polycrystalline silicon is to take place.

Figure 3A:
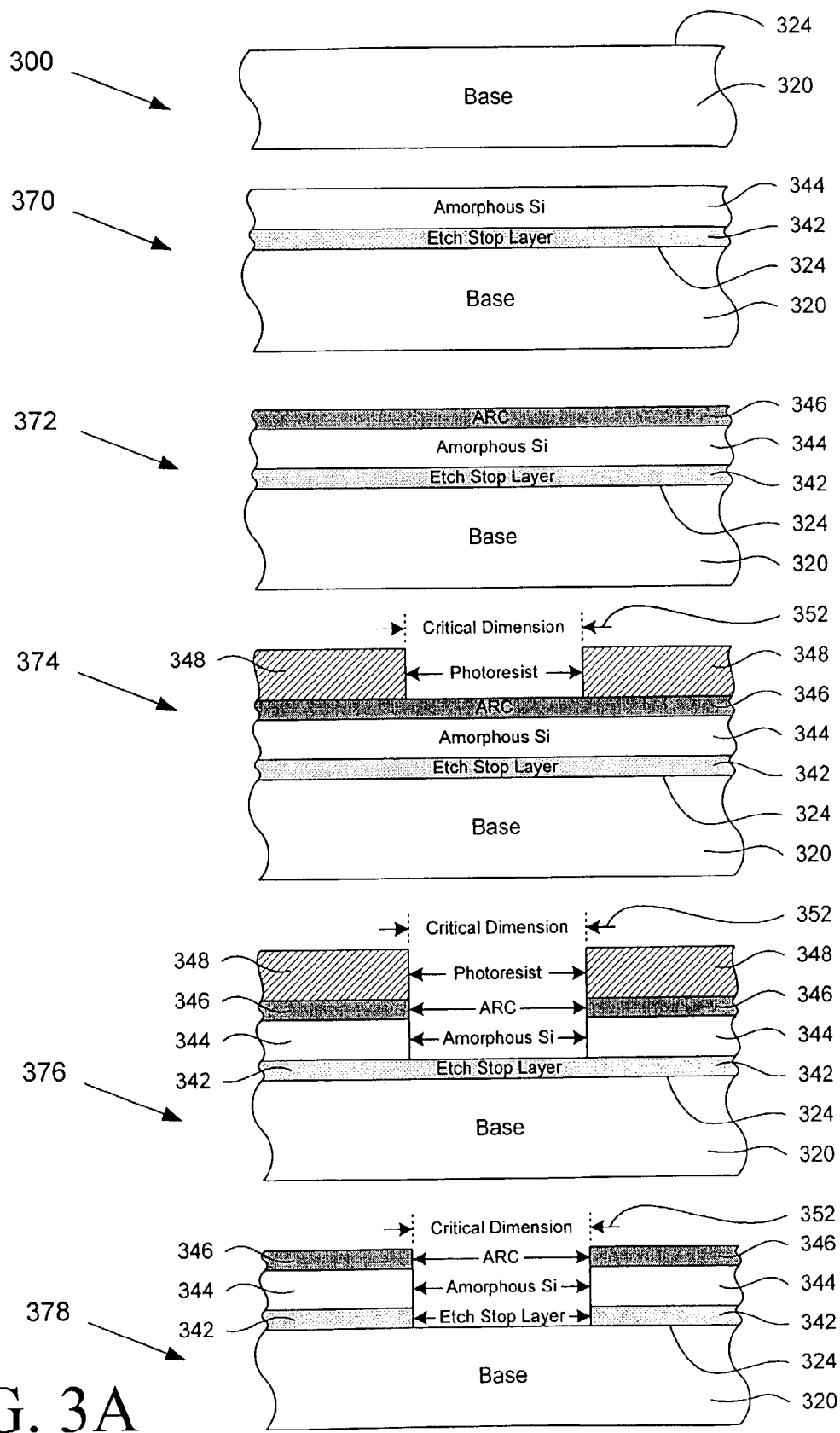
FIG. 3A, FIG. 3B, and FIG. 3C illustrate cross sectional views, which include portions of a silicon wafer processed according to an embodiment of the invention, corresponding to the steps of FIG. 2.

Referring now to FIG. 3A, structure 300 of FIG. 3A shows, in greater detail, a portion of structure 100 of FIG. 1. The portion of structure 100 shown in FIG. 3A is also referred to as a "selected semiconductor region" in the present application. Base 120 and top surface 124 of base 120 of structure 100 are shown respectively in structure 300 as base 320 and top surface 324 of base 320. For simplicity, other features such as base contact 122, interface 123, collector 102, buried layer 106, silicon substrate 107, collector sinker 108, deep trenches 112, and field oxide isolation regions 114, 115, and 116 are not shown in structure 300. Structure 300 thus shows the portion of a wafer including top surface 324 of base 320 on which formation of an emitter comprised of N-type polycrystalline silicon is to take place, before processing the wafer according to one embodiment of the invention as shown in flow chart 200. In particular, structure 300 shows a portion of the wafer before processing step 270 of flowchart 200.

Figure 3B:
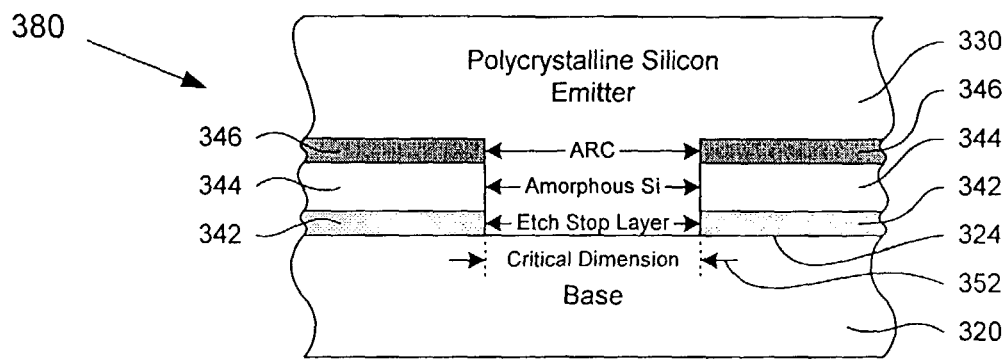
Figure 3B:
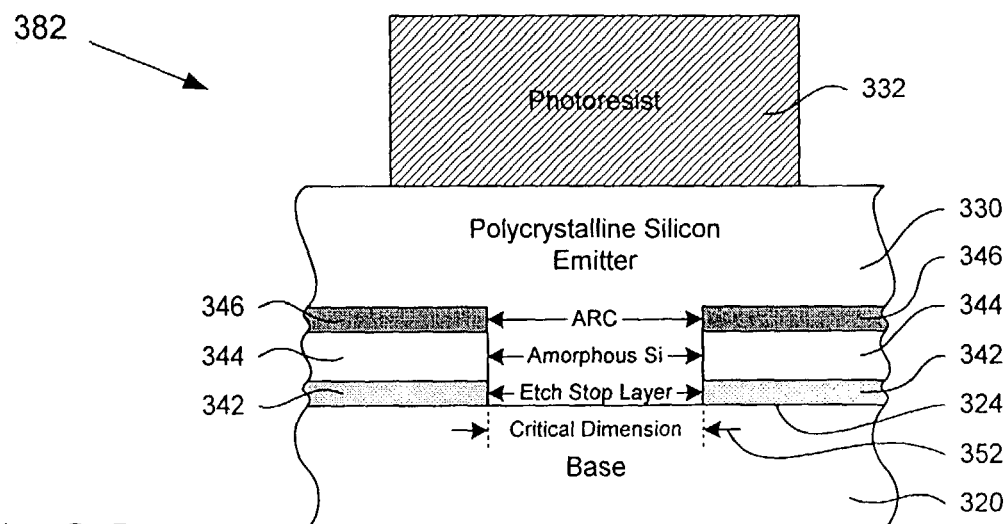
Figure 3C:
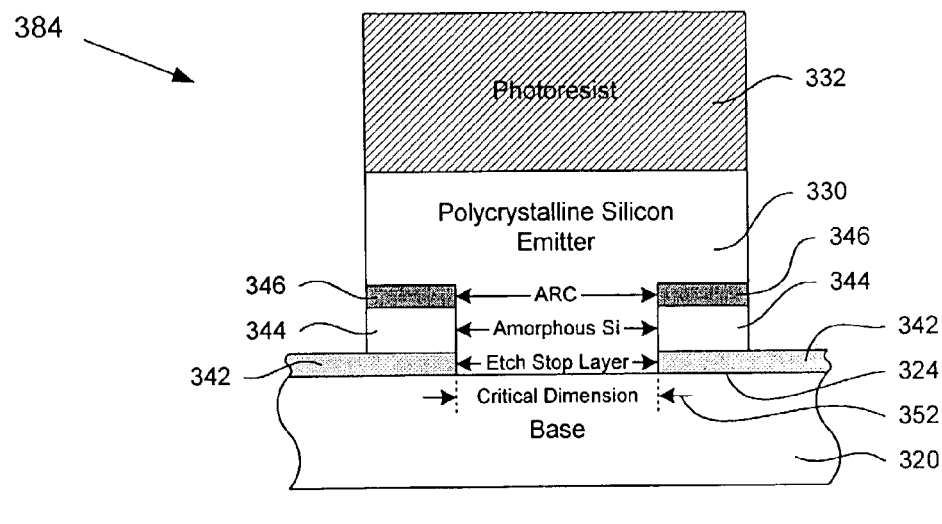
Figure 3C:
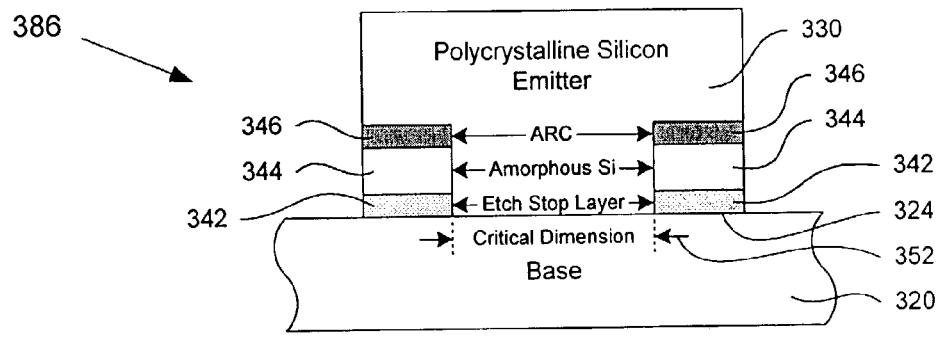

Referring to FIGS. 3A, 3B and 3C, each of structures 370, 372, 374, 376, 378, 380, 382, 384, and 386 of FIGS. 3A, 3B and 3C illustrates the result of performing, on structure 300, steps 270, 272, 274, 276, 278, 280, 282, 284, and 286, respectively, of flowchart 200 of FIG. 2. For example, structure 370 shows structure 300 after the processing of step 270; structure 372 shows structure 370 after the processing of step 272; and so forth.

Continuing with FIG. 2 and FIG. 3A, step 270 of flowchart 200 comprises forming amorphous silicon layer 344 on top of silicon dioxide (or "silicon oxide") etch stop layer 342 over the surface of structure 300, including top surface 324 of base 320. Silicon oxide etch stop layer 342 provides control for a subsequent etch step in processing the wafer. Etch stop layer 342 is in a range of approximately 200 to 500 Angstroms thick. The thickness of etch stop layer 342 affects control of critical dimension, discussed further below. Etch stop layer 342 may be composed of material other than silicon oxide and is formed in a manner known in the art. In other embodiments of the invention described here, amorphous silicon layer 344 may be replaced with other materials such as polycrystalline silicon, amorphous silicon-germanium, amorphous silicon carbide, or polycrystalline silicon carbide.

Referring to FIG. 3A, the result of step 270 of flow chart 200 is illustrated by structure 370. Etch stop layer 342 is also marked in structure 370 with the words "etch stop layer." Amorphous silicon layer 344 is also marked in structure 370 with the words "Amorphous Si" to indicate that it is composed of amorphous silicon. Structure 370 of FIG. 3A, then, shows structure 300, including top surface 324 of base 320 on which formation of an emitter comprised of N-type polycrystalline silicon is to take place, after the addition of silicon oxide etch stop layer 342 and amorphous silicon layer 344 in a manner known in the art.

Continuing with FIGS. 2 and 3A, step 272 of flowchart 200 comprises depositing silicon oxynitride anti-reflective coating ("ARC") 346 over amorphous silicon layer 344 and etch stop layer 342 formed in step 270. The addition of ARC 346 provides a number of functions, for example, reduction of "subsurface reflection" which degrades image definition of the photoresist by exposing portions of photoresist not intended to be exposed. Degradation of image definition is a factor in loss of control over critical dimension, discussed further below. Other types of anti-reflective coating could be used, for example, any of several types of spun-on polymer bottom anti-reflective coating or "BARC" as known in the art. Referring to FIG. 3A, the result of step 272 of flowchart 200 is illustrated by structure 372. ARC 346 deposited as the result of step 272 is indicated in structure 372 with the designation "ARC." Structure 372 of FIG. 3A, then, shows structure 370, including top surface 324 of base 320 on which formation of an emitter comprised of N-type polycrystalline silicon is to take place, after the addition of silicon oxynitride ARC 346.

Continuing with FIGS. 2 and 3A, step 274 of flowchart 200 comprises depositing photoresist 348 on top of ARC 346 and patterning photoresist 348. Photoresist 348 is indicated in structure 374 with the word "photoresist." The polycrystalline silicon emitter which is to be formed on top surface 324 of base 320 has critical dimension 352. Critical dimension 352 is indicated in structure 374 by a pair of dashed lines and arrows and the words "critical dimension." It is essential to achieving the desired performance of the silicon-germanium HBT that the final dimension of the width of the polycrystalline silicon emitter which is to be formed on top surface 324 of base 320 be substantially equal to critical dimension 352. Photoresist 348 is patterned in accordance with the objective of achieving a final dimension of the width of the polycrystalline silicon emitter substantially equal to critical dimension 352. While step 274 shows patterning using photoresist, other methods of patterning could be used, as understood by a person of ordinary skill in the art. Referring to FIG. 3A, the result of step 274 of flow chart 200 is illustrated by structure 374. Structure 374 of FIG. 3A, then, shows structure 372, including top surface 324 of base 320 on which formation of an emitter comprised of N-type polycrystalline silicon is to take place, after the addition and patterning of photoresist 348.

Continuing with FIGS. 2 and 3A, step 276 of flowchart 200 comprises selectively etching ARC 346 and amorphous silicon layer 344 of structure 374. The purpose of etching is to open a "window" onto top surface 324 of base 320. The window will allow for subsequent formation of an emitter comprised of N-type polycrystalline silicon on top surface 324 of base 320. The etching is done selectively, i.e. etchants are used which etch silicon oxynitride ARC 346 and amorphous silicon layer 344 but do not substantially etch silicon dioxide etch stop layer 342. Suitable etchants with the desired properties are known in the art. For example, etchants that could be used include $CF_4$ and chlorine compounds known in the art. Referring to FIG. 3A, the result of step 276 of flow chart 200 is illustrated by structure 376. The result of step 276 is indicated in structure 376 by an opening in ARC 346 and amorphous silicon layer 344 of width corresponding to the patterning in step 274. Structure 376 of FIG. 3A, then, shows structure 374, including top surface 324 of base 320 on which formation of an emitter comprised of N-type polycrystalline silicon is to take place, after etching ARC 346 and amorphous silicon layer 344 selective to etch stop layer 342.

Continuing with FIGS. 2 and 3A, step 278 of flowchart 200 comprises stripping photoresist 348 and removing etch stop layer 342 from top surface 324 of base 320 on which formation of an emitter comprised of N-type polycrystalline silicon is to take place. The purpose of stripping photoresist 348 is to prepare the wafer for further processing steps. Because photoresist 348 is no longer needed, it is stripped before further processing of the wafer. In addition, it is optional to either remove ARC 346 or leave it in structure 378. Although photoresist 348 has been used to etch ARC 346 and amorphous silicon layer 344, it will be apparent to a person of ordinary skill in the art that other methods of etching ARC 346 and amorphous silicon layer 344 according to a pattern could be used, and that, therefore, step 278 could be modified accordingly.

Continuing with step 278 of flowchart 200, silicon oxide etch stop layer 342 is removed from top surface 324 of silicon or silicon-germanium base 320 in manner known in the art. For example, an HF—hydrogen fluoride—clean can be used. Hydrogen fluoride does not etch either the amorphous silicon of amorphous silicon layer 344 or the silicon oxynitride of ARC 346. Therefore, removal of etch stop layer 342 using hydrogen fluoride does not affect ARC 346 or amorphous silicon layer 344. Removal of etch stop layer 342 using hydrogen fluoride is accompanied by lateral etching of etch stop layer 342. Lateral etching of etch stop layer 342 produces an "undercut" effect which increases critical dimension 352. The amount of lateral etching or "undercut" is dependent on the thickness of etch stop layer 342. Therefore, the thickness of etch stop layer 342 affects control of critical dimension 352, as noted above. Referring to FIG. 3A, the result of step 278 of flowchart 200 is illustrated by structure 378. The result of step 278 is indicated in structure 378 by an opening in etch stop layer 342 of a width corresponding to the patterning in step 274. Structure 378 of FIG. 3A, then, shows structure 376, including top surface 324 of base 320 on which formation of an emitter comprised of N-type polycrystalline silicon is to take place, after removal of silicon oxide etch stop layer 342 from top surface 324 of base 320.

Continuing with FIGS. 2 and 3B, step 280 of flowchart 200 comprises pre-cleaning top surface 324 of base 320, followed by depositing polycrystalline silicon to form emitter 330. For example, the pre-clean can be a hydrogen fluoride clean and the polycrystalline silicon can be deposited using RPCVD process. Emitter 330 can be doped with arsenic using an ion implantation process. The arsenic doping renders emitter 330 an N-type emitter. Referring to FIG. 3B, the result of step 280 of flow chart 200 is illustrated by structure 380. The result of step 280 is indicated in structure 380 by deposition of emitter 330 comprised of polycrystalline silicon. Structure 380 of FIG. 3B, then, shows structure 378 of FIG. 3A, including top surface 324 of base 320 on which formation of emitter 330 comprised of N-type polycrystalline silicon is to take place, after deposition of polycrystalline silicon emitter 330. In the present application the material filling the opening in layer 344 is also referred to generally as "filler material." To be sure, in the present embodiment, the "filler material" comprises polycrystalline silicon.

Continuing with FIGS. 2 and 3B, step 282 of flowchart 200 comprises depositing photoresist 332 on top of emitter 330 and patterning photoresist 332. Photoresist 332 is indicated in structure 382 with the word "photoresist." Photoresist 332 is patterned and aligned with previous patterning steps in a manner known in the art. While step 282 shows patterning using photoresist, other methods of patterning could be used, as understood by a person of ordinary skill in the art. Referring to FIG. 3B, the result of step 282 of flow chart 200 is illustrated by structure 382. Structure 382 of FIG. 3B, then, shows structure 380, including deposition of polycrystalline silicon emitter 330, after the addition and patterning of photoresist 332.

Referring to FIGS. 2 and 3C, step 284 of flowchart 200 comprises selectively etching emitter 330 of structure 382. The purpose of etching is to "trim" emitter 330, i.e., to localize the structure of emitter 330 to allow access to other features and components on the wafer which include, for example, the base contacts. The etching is done selectively, i.e. etchants are used which etch polycrystalline silicon emitter 330, silicon oxynitride ARC 346 and amorphous silicon layer 344 but do not substantially etch silicon dioxide etch stop layer 342. Suitable etchants with the desired properties are known in the art, and some examples have been noted above.

The properties of amorphous silicon layer 344 enables etchants to be chosen for which lateral etch of amorphous silicon layer 344 is smaller than with other materials which might be used in place of amorphous silicon layer 344 such as silicon nitride. Minimal lateral etch allows the width of amorphous silicon layer 344 to be made smaller. Referring to FIG. 3B, the result of step 284 of flow chart 200 is illustrated by structure 384. The result of step 284 is shown in structure 384 where emitter 330, ARC 346, and amorphous silicon layer 344 have a width corresponding to the patterning of photoresist 332. Structure 384 of FIG. 3C, then, shows structure 382 of FIG. 3B after formation of emitter 330 comprised of polycrystalline silicon on top surface 324 of base 320.

Continuing with FIGS. 2 and 3C, step 286 of flowchart 200 comprises stripping photoresist 332 and removing etch stop layer 342 from the surface of the wafer. The purpose of stripping photoresist 332 is to prepare the wafer for further processing steps. Because photoresist 332 is no longer needed, it is stripped before further processing of the wafer. Although photoresist 332 has been used to etch polycrystalline silicon emitter 330, silicon oxynitride ARC 346 and amorphous silicon layer 344, it will be apparent to a person of ordinary skill in the art that other methods of etching polycrystalline silicon emitter 330, silicon oxynitride ARC 346 and amorphous silicon layer 344 according to a pattern could be used, and that, therefore, step 286 could be modified accordingly.

Continuing with step 286 of flowchart 200, silicon oxide etch stop layer 342 is removed from the surface of the wafer. The purpose of removing etch stop layer 342 is to allow access for further processing to other features and components on the wafer which include, for example, the base contacts. Removal of silicon oxide etch stop layer 342 can be accomplished, for example, using hydrogen fluoride as discussed above. Referring to FIG. 3C, the result of step 286 of flow chart 200 is illustrated by structure 386. The result of step 286 is shown in structure 386 where emitter 330, ARC 346, amorphous silicon layer 344, and etch stop layer 342 have substantially uniform width. Etch stop layer 342 has been removed from the remainder of the wafer and photoresist 332 has been stripped. Structure 386 of FIG. 3C, then, shows structure 384 after formation of emitter 330 comprised of polycrystalline silicon on top surface 324 of base 320, stripping of photoresist 332, and removal of etch stop layer 342.

Figure 4:
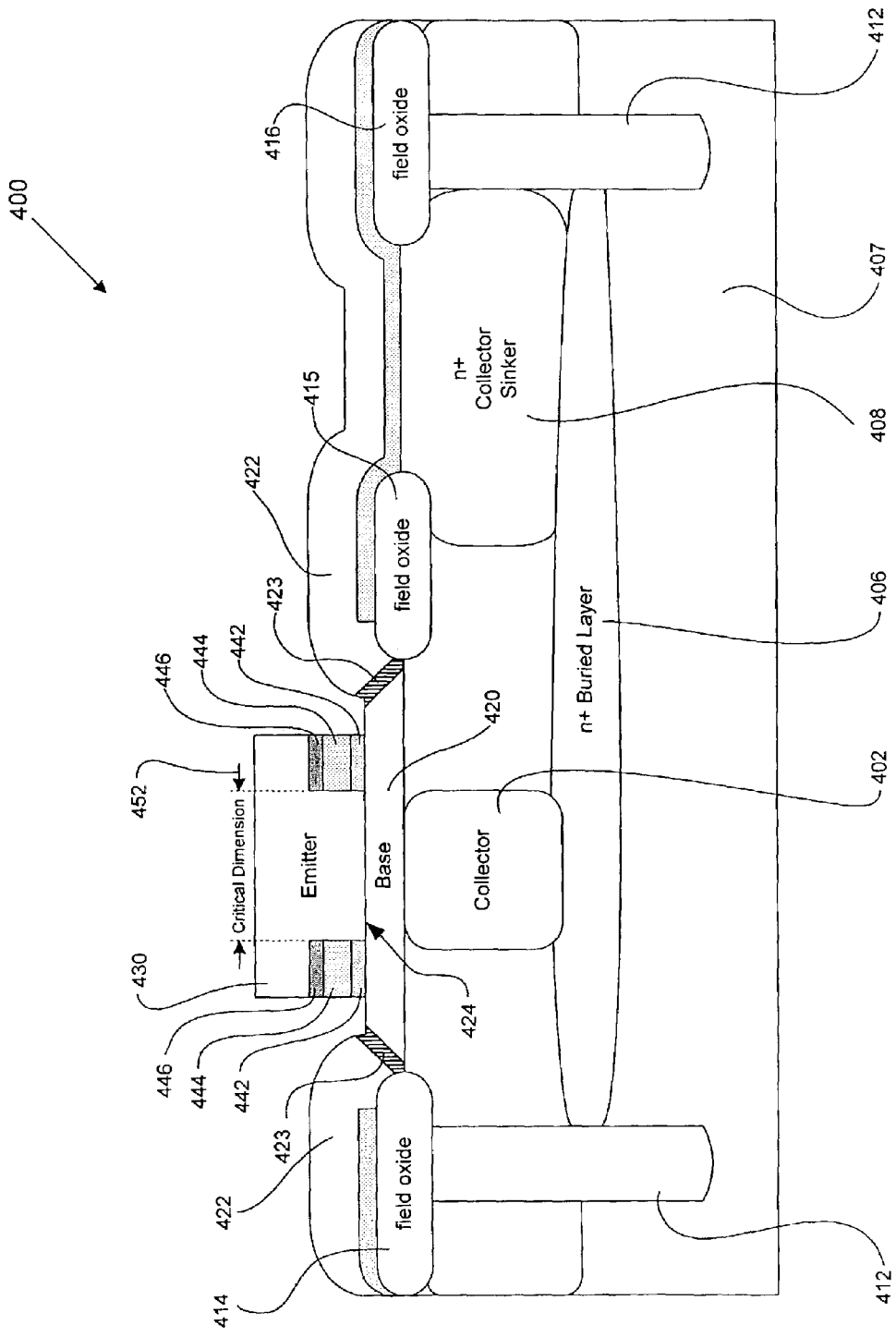
FIG. 4 illustrates a cross sectional view of some of the features of an NPN HBT fabricated in accordance with one embodiment of the present invention.

FIG. 4 shows structure 400, which illustrates structure 100 of FIG. 1 subsequent to step 284 of flow chart 200, more specifically after formation of emitter 330 comprised of N-type polycrystalline silicon and removal of etch stop layer 342. In particular, features and components 102, 104, 106, 107, 108, 112, 114, 115, 116, 120, 122, 123, and 124 of structure 100 of FIG. 1 are shown respectively as features and components 402, 404, 406, 407, 408, 412, 414, 415, 416, 420, 422, 423, and 424 of structure 400 of FIG. 4. In addition, emitter 330, etch stop layer 342, amorphous silicon layer 344, ARC 346, and critical dimension 352 of structure 384 of FIG. 3B are shown respectively in structure 400 of FIG. 4 as emitter 430, etch stop layer 442, amorphous silicon layer 444, ARC 446, and critical dimension 452. Thus, FIG. 4 shows structure 400 subsequent to step 284 of flow chart 200, after removal of etch stop layer 442, and after formation of emitter 430 comprised of N-type polycrystalline silicon on top surface 424 of base 420.

FIG. 4 shows structure 400 after formation of emitter 430 of the NPN HBT. Emitter 430 has critical dimension 452. As discussed above, it is critical for satisfactory performance of the HBT that the width of emitter 430 be substantially equal to critical dimension 452. The width of emitter 430 is determined by the etch of ARC 446 and amorphous silicon layer 444 in step 276 and removal of etch stop layer 442 in step 278 of flow chart 200. The properties of amorphous silicon layer 444 enables etchants to be chosen for which lateral etch of amorphous silicon layer 444 is smaller than with other materials which might be used in place of amorphous silicon layer 444 such as silicon nitride. Minimal lateral etch allows good control of critical dimension 452. Additionally, as pointed out above, removal of silicon oxide etch stop layer 442 from surface 424 of silicon-germanium base 420 using hydrogen fluoride has the advantage that it does not etch either the amorphous silicon of amorphous silicon layer 444 or the silicon oxynitride of ARC 446. Therefore, removal of etch stop layer 442 using hydrogen fluoride does not affect ARC 446 or amorphous silicon layer 444. Because hydrogen fluoride does not etch either the amorphous silicon layer 444 or the silicon oxynitride of ARC 446, one embodiment of the present invention described here achieves improved control of critical dimension 452.

Further, removal of etch stop layer 442 using hydrogen fluoride is accompanied by lateral etching of etch stop layer 442. Lateral etching of etch stop layer 442 produces an "undercut" effect which increases critical dimension 452. The amount of lateral etching or "undercut" is dependent on the thickness of etch stop layer 442. Generally, a thinner layer has less undercut. Therefore, a thinner etch stop layer will have less effect on critical dimension 452. The thickness of etch stop layer 442 in one embodiment of the invention described here is in the range of approximately 200.0 to 500.0 Angstroms. For an etch stop layer approximately 300 Angstroms thick, for example, with feature size approximately equal to 0.25 microns, the undercut is approximately 0.015 microns on each side of critical dimension 452, for a total error of approximately 0.03 microns. In other words, because the thickness of etch stop layer 442 is minimal, one embodiment of the present invention described here achieves improved control of critical dimension 452.

Emitter 430 can be formed with emitter width substantially as small as the resolution of photolithographic techniques will allow because one embodiment of the invention described here achieves control of critical dimension 452 by controlling lateral etch of amorphous silicon layer 444 and etch stop layer 442 and using ARC 446. Thus one embodiment of the invention described here allows formation of an HBT with feature size substantially as small as photolithography is capable of producing.

It is appreciated by the above detailed disclosure that the invention provides a method for formation of an emitter in an HBT, in which critical dimension is accurately controlled, and which is substantially as small as photolithographic techniques allow. Although the invention is described as applied to the construction of a heterojunction bipolar transistor, it will be readily apparent to a person of ordinary skill in the art how to apply the invention in similar situations where a smaller emitter structure is required.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, as stated above, amorphous silicon layer 344 can be replaced with alternative layers comprised of polycrystalline silicon, amorphous silicon-germanium, amorphous silicon-carbide, or polycrystalline silicon carbide without departing from the scope of the present invention. Moreover, although anti-reflective coating ("ARC") layer 346 has been utilized in the specific embodiment of the invention described above, it is noted that other embodiments of the invention can be practiced without the use of an anti-reflective coating layer. The described embodiments are to be considered in all respects as illustrative and not restrictive. For example, although in the specific embodiment of the invention described above, emitter 330 was described as a polycrystalline silicon emitter, it is possible to use an amorphous silicon emitter which is recrystallized to form a polycrystalline silicon emitter. Moreover, the invention's teachings regarding controlling critical dimension can also be applied to control critical dimensions in contexts other than controlling emitter width as specifically described in the present application. For example, the invention's teachings can be applied to achieve critical dimensions for small features such as contact openings in Flash EEPROMS or other semiconductor devices. Therefore, it should be understood that the invention is not limited to the particular embodiments described herein, but is capable of many rearrangements, modifications, and substitutions without departing from the scope of the invention.

What is claimed is:

1. A structure comprising:
   an etch stop layer on top of a base;
   an amorphous layer on top of said etch stop layer;
   an anti-reflective coating layer on top of said amorphous layer, said anti-reflective coating layer and said amorphous layer having an opening, said opening having an opening width substantially equal to a critical dimension;

a polycrystalline emitter inside said opening in said anti-reflective coating layer and said amorphous layer, said polycrystalline emitter being in contact with said anti-reflective coating layer and said amorphous layer in said opening, said polycrystalline emitter in said opening having an emitter width substantially equal to said critical dimension;

wherein said polycrystalline emitter has a substantially uniform width in said opening in said anti-reflective coating layer and said amorphous layer.

2. The structure of claim 1 wherein said base comprises silicon-germanium.

3. The structure of claim 1 wherein said amorphous layer comprises amorphous silicon.

4. The structure of claim 1 wherein said etch stop layer comprises silicon oxide.

5. The structure of claim 1 wherein said polycrystalline emitter comprises polycrystalline silicon.

6. The structure of claim 1 wherein said anti-reflective coating layer comprises silicon oxynitride.

* * * * *